(12) United States Patent
Okhonin et al.

(10) Patent No.: US 7,251,164 B2
(45) Date of Patent: Jul. 31, 2007

(54) CIRCUITRY FOR AND METHOD OF IMPROVING STATISTICAL DISTRIBUTION OF INTEGRATED CIRCUITS

(75) Inventors: Serguei Okhonin, Lausanne (CH); Mikhail Nagoga, Pully (CH)

(73) Assignee: Innovative Silicon S.A., Lausanne (CH)

( * ) Notice: Subject to any disclaimer, the term of this patent is extended or adjusted under 35 U.S.C. 154(b) by 0 days.

(21) Appl. No.: 11/247,774

(22) Filed: Oct. 11, 2005

(65) Prior Publication Data

US 2006/0098481 A1    May 11, 2006

Related U.S. Application Data

(60) Provisional application No. 60/626,745, filed on Nov. 10, 2004.

(51) Int. Cl.
*G11C 16/04* (2006.01)
(52) U.S. Cl. .................. 365/185.18; 365/185.21; 365/185.26
(58) Field of Classification Search .......... 365/185.18, 365/185.21, 185.26
See application file for complete search history.

(56) References Cited

U.S. PATENT DOCUMENTS

| | | | |
|---|---|---|---|
| 3,439,214 | A | 4/1969 | Kabell |
| 3,997,799 | A | 12/1976 | Baker |
| 4,032,947 | A | 6/1977 | Kesel et al. |
| 4,250,569 | A | 2/1981 | Sasaki et al. |
| 4,262,340 | A | 4/1981 | Sasaki et al. |
| 4,298,962 | A | 11/1981 | Hamano et al. |
| 4,371,955 | A | 2/1983 | Sasaki |
| 4,527,181 | A | 7/1985 | Sasaki |
| 4,630,089 | A | 12/1986 | Sasaki et al. |
| 4,791,610 | A | 12/1988 | Takemae |
| 4,979,014 | A | 12/1990 | Hieda et al. |
| 5,144,390 | A | 9/1992 | Matloubian |

(Continued)

FOREIGN PATENT DOCUMENTS

EP    0 030 856    6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—David Lam
(74) *Attorney, Agent, or Firm*—Neil A. Steinberg

(57) ABSTRACT

An integrated circuit device comprising a memory cell array including a plurality of memory cells wherein each memory cell includes at least one electrically floating body transistor having source, drain and a body regions, wherein the body region is electrically floating and disposed between the source and drain regions; a gate is disposed over the body region. Each memory cell includes a first data state representative of a first charge in the body region and a second data state representative of a second charge in the body region. The integrated circuit device further includes operating characteristics adjustment circuitry, coupled to the memory cell array, to adjust one or more operating or response characteristics of one or more memory cells to improve the uniformity of operation/response characteristics of the memory cells of the memory cell array relative to the other memory cells of the array.

20 Claims, 10 Drawing Sheets

U.S. PATENT DOCUMENTS

| | | | |
|---|---|---|---|
| 5,258,635 | A | 11/1993 | Nitayama et al. |
| 5,388,068 | A | 2/1995 | Ghoshal et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,528,062 | A | 6/1996 | Hsieh et al. |
| 5,568,356 | A | 10/1996 | Schwartz |
| 5,593,912 | A | 1/1997 | Rajeevakumar |
| 5,606,188 | A | 2/1997 | Bronner et al. |
| 5,627,092 | A | 5/1997 | Alsmeier et al. |
| 5,631,186 | A | 5/1997 | Park et al. |
| 5,696,718 | A | 12/1997 | Hartmann |
| 5,740,099 | A | 4/1998 | Tanigawa |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,811,283 | A | 9/1998 | Sun |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,936,888 | A * | 8/1999 | Sugawara ............... 365/185.21 |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,968,840 | A | 10/1999 | Park et al. |
| 5,977,578 | A | 11/1999 | Tang |
| 5,982,003 | A | 11/1999 | Hu et al. |
| 6,018,172 | A | 1/2000 | Hidada et al. |
| 6,081,443 | A | 6/2000 | Morishita |
| 6,096,598 | A | 8/2000 | Furukawa et al. |
| 6,097,056 | A | 8/2000 | Hsu et al. |
| 6,111,778 | A | 8/2000 | MacDonald et al. |
| 6,121,077 | A | 9/2000 | Hu et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,708 | B1 | 1/2001 | Kuang et al. |
| 6,188,606 | B1 * | 2/2001 | Derhacobian et al. . 365/185.18 |
| 6,214,694 | B1 | 4/2001 | Leobandung et al. |
| 6,225,158 | B1 | 5/2001 | Furukawa et al. |
| 6,245,613 | B1 | 6/2001 | Hsu et al. |
| 6,252,281 | B1 | 6/2001 | Yamamoto et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,320,227 | B1 | 11/2001 | Lee et al. |
| 6,333,532 | B1 | 12/2001 | Davari et al. |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,538,916 | B2 | 3/2003 | Ohsawa |
| 6,544,837 | B1 | 4/2003 | Divakaruni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,556,477 | B2 | 4/2003 | Hsu et al. |
| 6,563,741 | B2 * | 5/2003 | Mihnea et al. ......... 365/185.29 |
| 6,566,177 | B1 | 5/2003 | Radens et al. |
| 6,567,330 | B2 | 5/2003 | Fujita et al. |
| 6,590,258 | B2 | 7/2003 | Divakauni et al. |
| 6,590,259 | B2 | 7/2003 | Adkisson et al. |
| 6,617,651 | B2 | 9/2003 | Ohsawa |
| 6,621,725 | B2 | 9/2003 | Ohsawa |
| 6,632,723 | B2 | 10/2003 | Watanabe et al. |
| 6,650,565 | B1 | 11/2003 | Ohsawa |
| 2001/0055859 | A1 | 12/2001 | Yamada et al. |
| 2002/0030214 | A1 | 3/2002 | Horiguchi |
| 2002/0034855 | A1 | 3/2002 | Horiguchi et al. |
| 2002/0036322 | A1 | 3/2002 | Divakauni et al. |
| 2002/0051378 | A1 | 5/2002 | Ohsawa |
| 2002/0064913 | A1 | 5/2002 | Adkisson et al. |
| 2002/0070411 | A1 | 6/2002 | Vermandel et al. |
| 2002/0072155 | A1 | 6/2002 | Liu et al. |
| 2002/0076880 | A1 | 6/2002 | Yamada et al. |
| 2002/0086463 | A1 | 7/2002 | Houston et al. |
| 2002/0089038 | A1 | 7/2002 | Ning |
| 2002/0098643 | A1 | 7/2002 | Kawanaka et al. |
| 2002/0110018 | A1 | 8/2002 | Ohsawa |
| 2002/0114191 | A1 | 8/2002 | Iwata et al. |
| 2002/0130341 | A1 | 9/2002 | Horiguchi et al. |
| 2002/0160581 | A1 | 10/2002 | Watanabe et al. |
| 2002/0180069 | A1 | 12/2002 | Houston |
| 2003/0003608 | A1 | 1/2003 | Arikado et al. |
| 2003/0015757 | A1 | 1/2003 | Ohsawa |
| 2003/0035324 | A1 | 2/2003 | Fujita et al. |
| 2003/0057487 | A1 | 3/2003 | Yamada et al. |
| 2003/0057490 | A1 | 3/2003 | Nagano et al. |
| 2003/0102497 | A1 | 6/2003 | Fried et al. |
| 2003/0112659 | A1 | 6/2003 | Ohsawa |
| 2003/0123279 | A1 | 7/2003 | Aipperspach et al. |
| 2003/0146488 | A1 | 8/2003 | Nagano et al. |
| 2003/0151112 | A1 | 8/2003 | Yamada et al. |
| 2005/0195680 | A1 | 9/2005 | Higashi et al. |
| 2005/0226070 | A1 | 10/2005 | Ohsawa |
| 2005/0232043 | A1 | 10/2005 | Ohsawa |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |

| | | |
|---|---|---|
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 8/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | 62-272561 | 11/1987 |
| JP | 02-294076 | 2/1991 |
| JP | 03171768 | 7/1991 |
| JP | 08213624 | 8/1996 |
| JP | 8-274277 | 10/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No.5, May 1990, pp. 1373-1382.

"Mechanisums of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 μm SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMS", Lee et al., Proceedings 1996 IEEE International SOI Conference, Oct. 1996, pp. 114-115.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Wei nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-Induced Drain Leakage (GIDL) Current for Low-Power and High-speed Embedded Memory", Yoshida et al., 2003 IEEE, 4 pages.

"A Study on High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97TH8303), pp. 339-342, no date.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

Hot-Carrier Effect in Ultra-Thin-Film (UTF) Fully-Depleted SOI MOSFET's, Yu et al., 54th Annual Device Research Conference Digest (Cat. No. 96TH8193), pp. 22-23, no date.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Date Retention SOI DRAM with the Body Refresh Function", Tomishima et al., IEICE Trans. Electron., vol. E80-C, No. 7, Jul. 1997, pp. 899-904.

* cited by examiner

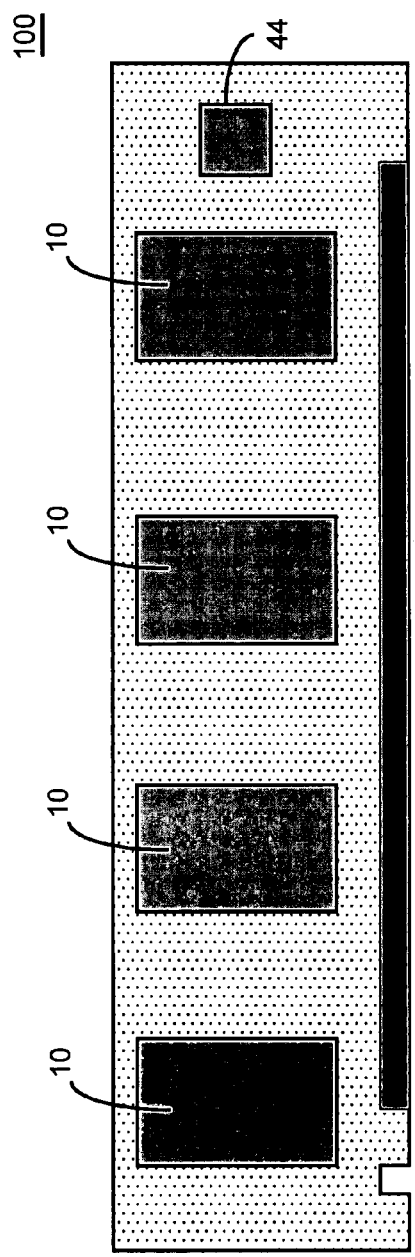
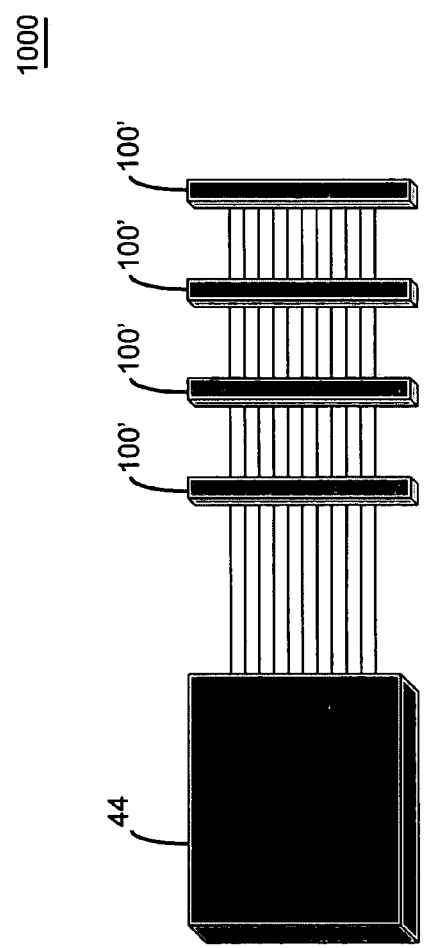
FIGURE 7A
FIGURE 7B

CIRCUITRY FOR AND METHOD OF IMPROVING STATISTICAL DISTRIBUTION OF INTEGRATED CIRCUITS

RELATED APPLICATIONS

This application claims priority to U.S. Provisional Application Ser. No. 60/626,745, entitled "Method of Improving Statistical Distribution of IC and IC Implementing Same", filed Nov. 10, 2004. The contents of this provisional application are incorporated by reference herein in their entirety.

BACKGROUND

In one aspect, the inventions relate to a semiconductor memory cell, array, and device, and techniques for improving, enhancing and/or controlling variations of operating and/or response parameter(s) or characteristic(s) of the memory cell, array and/or device; and more particularly, in one aspect, to improving, enhancing and/or controlling variations of such parameter(s) or characteristic(s) of the semiconductor dynamic random access memory ("DRAM") cell, array and/or device wherein the memory cell(s) includes an electrically floating body in which an electrical charge is stored.

Briefly, there is a continuing trend to employ and/or fabricate advanced integrated circuits using techniques, materials and devices that improve performance, reduce leakage current and enhance overall scaling. However, scaling down of transistor sizes often leads to increase of variations of the operating and/or response characteristics. These variations or mismatch tend to have a significant impact on precision integrated circuit ("IC") design. Indeed, due to variations or mismatch, IC designers, such as DRAM designers, typically include substantial design margin or risk yield loss, both of which adversely affect speed, efficiency and production costs.

One type of dynamic random access memory cell is based on, among other things, a floating body effect of Silicon-on-Insulator ("SOI") transistors. (See, for example, U.S. patent application Ser. No. 10/450,238, Fazan et al., filed Jun. 10, 2003 and entitled "Semiconductor Device", hereinafter "Semiconductor Memory Device Patent Application"). In this regard, the memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

Such an electrically floating body memory cell has at least two current states corresponding to different logic states, for example, a logic high or State "1" and a logic low or State "0". With reference to FIGS. 1A, 1B and 1C, in one embodiment, semiconductor DRAM device 10 includes a plurality of memory cells 12, arranged in an array 10a, wherein each memory cell 12 includes transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in SOI material/substrate) or non-conductive region (for example, in bulk-type material). The insulation or non-conductive region is disposed on substrate 26.

Notably, the entire contents of the Semiconductor Memory Device Patent Application, including, for example, the features, attributes, architectures, configurations, materials, techniques and advantages described and illustrated therein, are incorporated by reference herein. SOI is a material in which such devices may be fabricated on or in (hereinafter collectively "on"). Such devices are known as SOI devices and include, for example, partially depleted (PD), fully depleted (FD) devices, multiple gate devices (for example, double or triple gate), and Fin-FET. SOI devices have demonstrated improved performance (for example, speed), reduced leakage current characteristics and considerable enhancement in scaling.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. As mentioned above, memory cell 12 of DRAM array 10 operates by accumulating majority carriers (electrons or holes) 34 in, or emitting/ejecting majority carriers 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or State "1". (See, FIG. 2A). Emitting or ejecting majority carriers 30 from body region 18 via, for example, forward biasing the source/body junction and/or the drain/body junction, is representative of a logic low or State "0". (See, FIG. 2B).

Reading is performed by comparison of a cell current with the current from a reference cell that is usually placed between the State "1" and State "0". Several techniques may be implemented to read the data stored in (or write the data into) memory cells 12 of DRAM device 10. For example, a current sense amplifier (not illustrated) may be employed to read the data stored in memory cells 12. In this regard, a current sense amplifier may compare the cell current to a reference current, for example, the current of a reference cell (not illustrated). From that comparison, it may be determined whether memory cell 12 contained a logic high (relatively more majority carries 34 contained within body region 18) or logic low data state (relatively less majority carries 28 contained within body region 18).

For at least the purposes of this discussion, logic high or State "1" corresponds to an increased concentration of majority carries in the body region relative to a non-programmed device and/or a device that is programmed with a logic low or State "0". In contrast, logic low or State "0" corresponds to a reduced concentration of majority carries in the body region relative to a non-programmed device and/or a device that is programmed with a logic high or State "1 ".

A sufficiently large statistical variation in the device characteristics (for example, device currents) may cause or lead to an erroneous reading of the data state stored in the device. (See, FIG. 3). In contrast, a narrow statistical variation in the device characteristics tends to enhance uniformity of operation and performance of the devices. This provides greater confidence that the data stored in the memory device is correctly read during a read operation.

While electrically floating body transistors of memory cells (for example, SOI transistors) are highly scalable, variations or mismatch of transistor characteristics result in IC designers incorporating significant design margin to enhance or maximize yield. There is a need for ICs (for example, ICs that include electrically floating body transistors of memory cells) that incorporate circuitry and/or techniques that address variations or mismatch of transistor characteristics. In this way, IC designers may eliminate the need for substantial design margin or risk yield loss, which may adversely affect speed, efficiency and production costs.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to an integrated circuit device comprising a memory array including a plurality of memory cells wherein each memory cell includes at least one electrically floating body transistor having a source region, a drain region, a body region disposed between the source region and the drain region, wherein the body region is electrically floating and a gate disposed over the body region and separated therefrom by a gate dielectric. Each memory cell includes a first data state representative of a first charge in the body region and a second data state representative of a second charge in the body region wherein the second charge is substantially provided by removing charge from the body region through the gate. The integrated circuit device further includes operating characteristics adjustment circuitry, coupled to the memory cell array, to responsively adjust one or more operating or response characteristics of one or more predetermined memory cells and thereby enhance the uniformity of operation or response of the predetermined memory cells of the memory array relative to the plurality of memory cells of the memory array.

In one embodiment, the operating characteristics adjustment circuitry adjusts one or more operating or response characteristics of one or more predetermined memory cells by applying a bias to one or more of the word line, source line and/or bit line associated with the one or more predetermined memory cells.

In another embodiment, the operating characteristics adjustment circuitry adjusts one or more operating or response characteristics of one or more predetermined memory cells by applying a threshold voltage shift in the one or more predetermined memory cells.

In yet another embodiment, the operating characteristics adjustment circuitry adjusts one or more operating or response characteristics of one or more predetermined memory cells by adjusting the reference voltage applied to the sense amplifier which is associated with the one or more predetermined memory cells.

The integrated circuit device of this aspect of the inventions may also include control logic, coupled to the operating characteristics adjustment circuitry, to control the operating characteristics adjustment circuitry to adjust one or more operating or response characteristics of one or more predetermined memory cells and thereby enhance the uniformity of operation or response of the predetermined memory cells of the memory array relative to the plurality of memory cells of the memory array.

In another aspect, the present inventions are directed to a system comprising a first integrated circuit device including memory array including a plurality of memory cells wherein each memory cell includes at least one electrically floating body transistor having a source region, a drain region, a body region disposed between the source region and the drain region, wherein the body region is electrically floating, and a gate disposed over the body region and separated therefrom by a gate dielectric. The memory cells include a first data state representative of a first charge in the body region and a second data state representative of a second charge in the body region, wherein the second charge is substantially provided by removing charge from the body region through the gate. The first integrated circuit device also includes operating characteristics adjustment circuitry, coupled to the memory cell array, to responsively adjust one or more operating or response characteristics of one or more predetermined memory cells and thereby enhance the uniformity of operation or response of the plurality of memory cells of the memory array.

The system further includes a bus and a second integrated circuit device including control logic, coupled to the operating characteristics adjustment circuitry via the bus, to control the operating characteristics adjustment circuitry to adjust one or more operating or response characteristics of one or more predetermined memory cells and thereby enhance the uniformity of operation or response of the predetermined memory cells of the memory array relative to the plurality of memory cells of the memory array.

In one embodiment of this aspect of the inventions, the operating characteristics adjustment circuitry adjusts one or more operating or response characteristics of one or more predetermined memory cells by applying a bias to one or more of the word line, source line and/or bit line associated with the one or more predetermined memory cells. In another embodiment, the operating characteristics adjustment circuitry adjusts one or more operating or response characteristics of one or more predetermined memory cells by applying a threshold voltage shift in the one or more predetermined memory cells. In yet another embodiment, the operating characteristics adjustment circuitry adjusts one or more operating or response characteristics of one or more predetermined memory cells by adjusting the reference voltage applied to the sense amplifier which is associated with the one or more predetermined memory cells.

In one embodiment, the control logic of the second integrated circuit enables the operating characteristics adjustment circuitry to adjust one or more operating or response characteristics of one or more predetermined memory cells and thereby enhance the uniformity of operation or response of the plurality of memory cells of the memory array based on at least the amount of time the first integrated circuit device has been in operation or deployed.

In another aspect, the present inventions are directed to a method of operating an integrated circuit device comprising a memory array including a plurality of memory cells having a state, and operating characteristics adjustment circuitry, coupled to the memory cell array, to responsively adjust one or more operating or response characteristics of one or more predetermined memory cells and thereby enhance the uniformity of operation or response of the plurality of memory cells of the memory array. The method comprises applying control signals to the memory cells, via associated word, source and/or bit lines, to read the data state of the memory cells, and applying a bias voltage to the word line, source line and/or bit line associated with the one or more predetermined memory cells to enhance the uniformity of operation or response of the predetermined memory cells relative to the plurality of memory cells of the memory array.

In one embodiment, each memory cell includes at least one electrically floating body transistor having a source region, a drain region, a body region disposed between the source region and the drain region, wherein the body region is electrically floating and a gate disposed over the body region and separated therefrom by a gate dielectric. The memory cell includes a first data state representative of a first charge in the body region, and a second data state representative of a second charge in the body region, wherein the second charge is substantially provided by removing charge from the body region through the gate. The method of this embodiment further includes applying a threshold voltage shift in the one or more predetermined memory cells via applying a bias voltage to the word line, source line and/or bit line associated with the one or more predetermined memory cells.

In another embodiment, each memory cell includes a floating gate and the method further includes adjusting the floating gate charge for the predetermined memory cells to enhance the uniformity of operation or response of the predetermined memory cells relative to the plurality of memory cells of the memory array.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIGS. 7A-7C are schematic representations of exemplary architectures and/or embodiment of implementing a controller/processor in conjunction with memory devices having operating characteristics adjustment circuitry, in accordance with the present inventions.

DETAILED DESCRIPTION

At the outset, it should be noted that there are many inventions described herein as well as many aspects and embodiments of those inventions.

In a first aspect, the present inventions are directed to circuitry and techniques for improving, enhancing and/or controlling variations of operating and/or response characteristic(s) of integrated circuits or circuit devices, for example, memory cells, arrays and/or devices. In one embodiment, the techniques employ an input (for example, electrical bias, light, heat and control signal) to change the operating and/or response characteristic(s) of the integrated circuit and/or transistors therein, for example, memory cell, array and device. In this way, variations of operating and/or response characteristic(s) may be controlled, enhanced and/or improved; thereby reducing, eliminating and/or minimizing statistical variations in the device characteristics (for examples device currents). As mentioned above, a narrow statistical variation in the device characteristics tends to enhance uniformity of operation and performance of the devices, which leads to greater confidence that the data stored in the memory device is correctly read during, for example, a read operation.

Figure 1A:
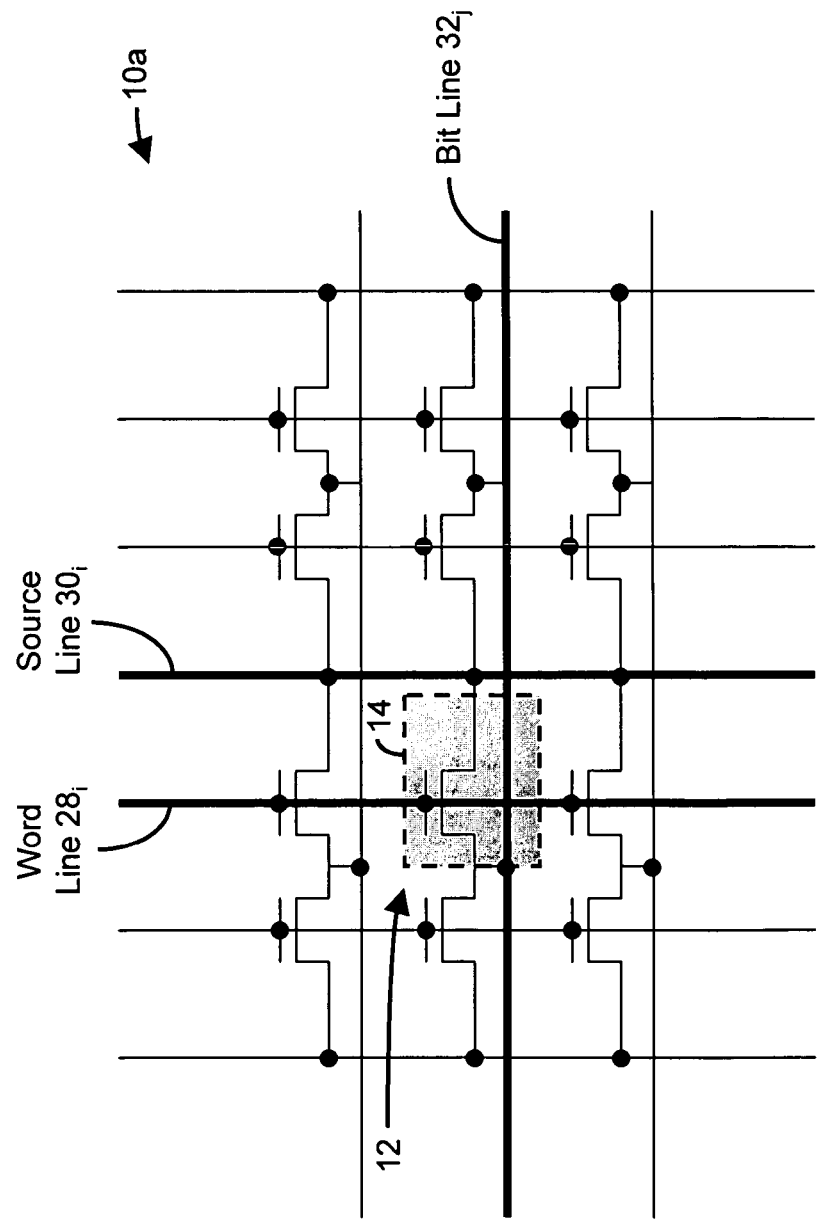
FIG. 1A is a schematic representation of a prior art semiconductor DRAM array including a plurality of memory cells comprised of one electrically floating body transistor.
Figure 1B:
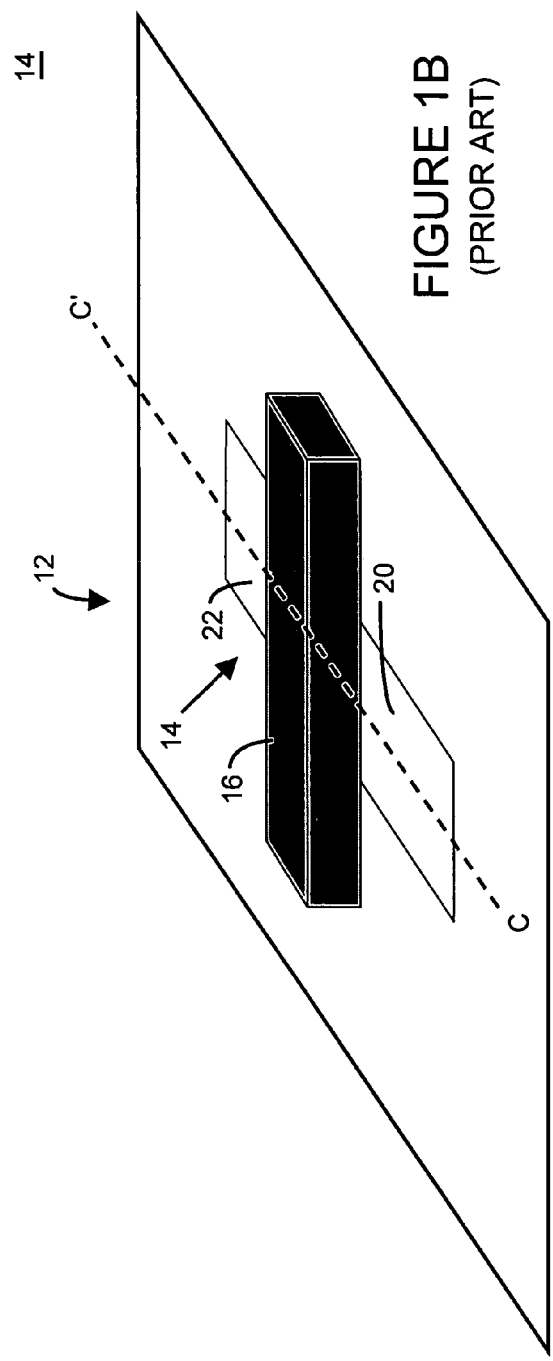
FIG. 1B is a three dimensional view of an exemplary prior art memory cell comprised of one electrically floating body transistor (PD-SOI NMOS)
Figure 1C:
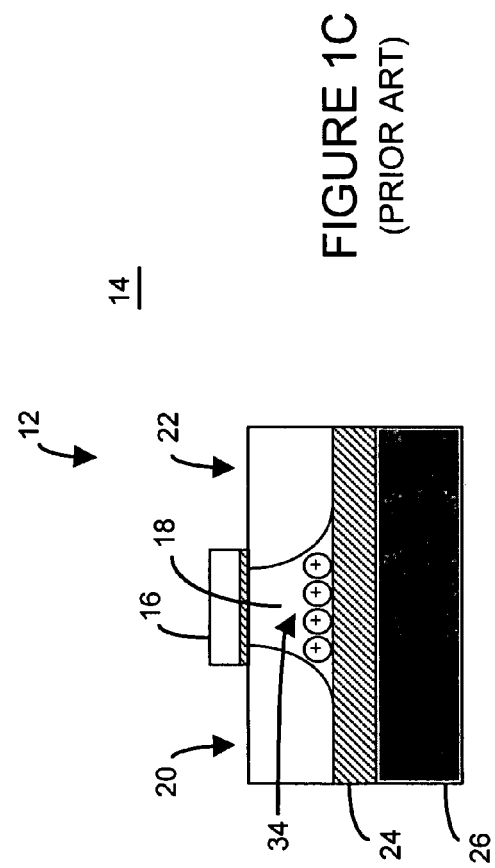
FIG. 1C is a cross-sectional view of the prior art memory cell of FIG. 1B, cross-sectioned along line C-C'.
Figure 2A:
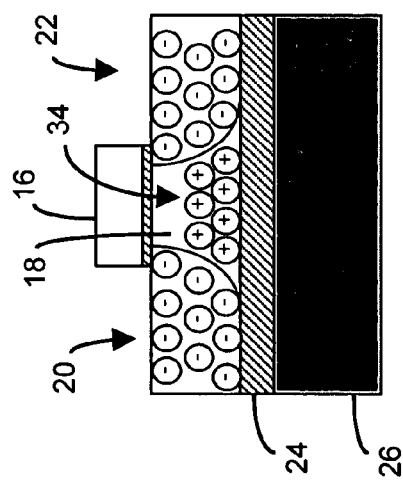
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
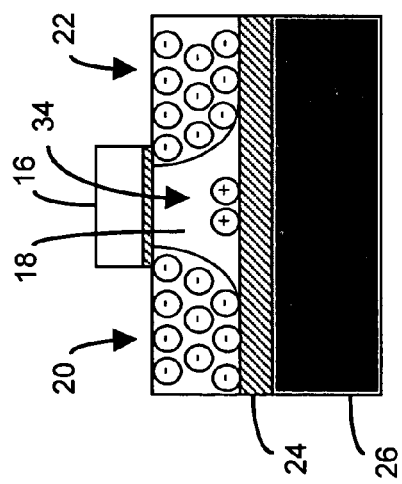
Figure 3:
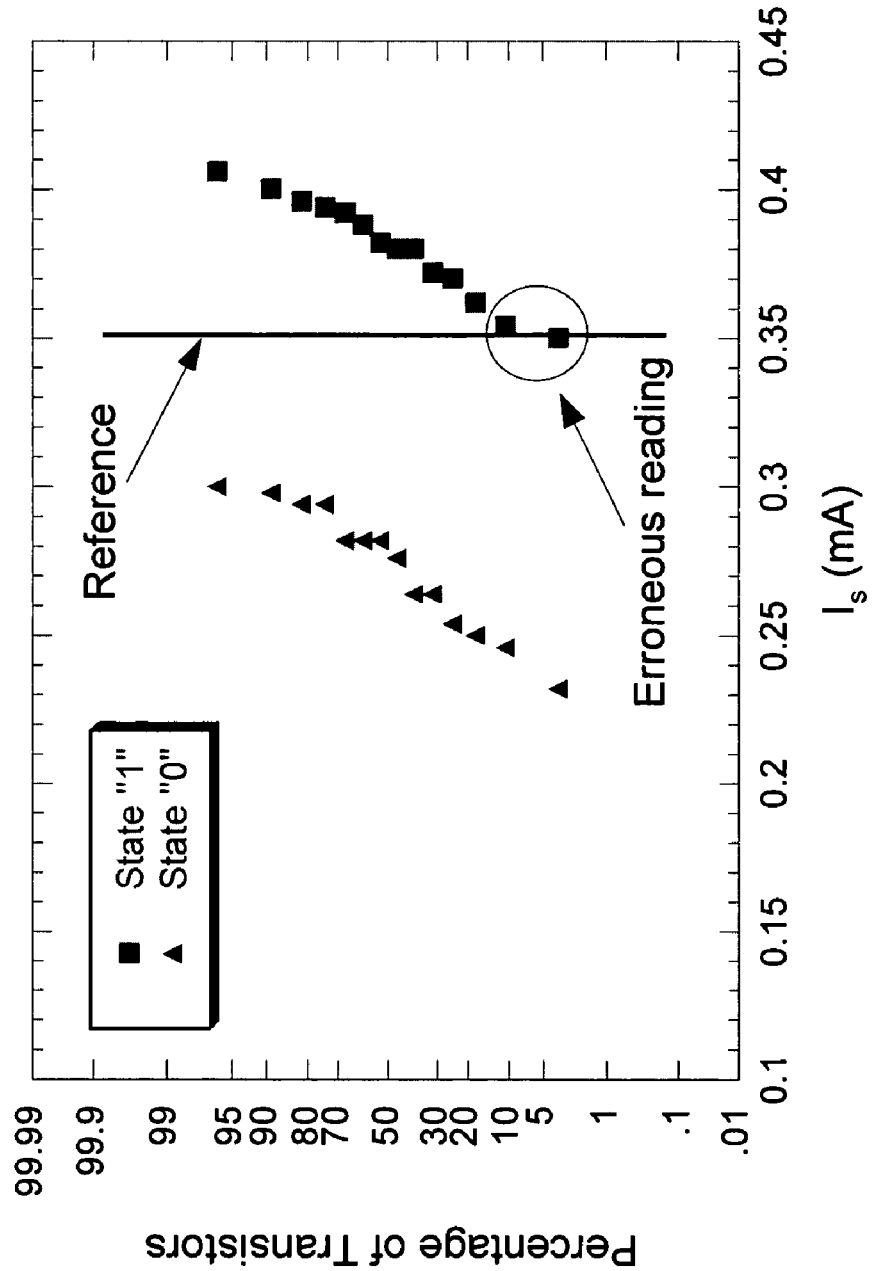
FIG. 3 illustrates statistical variations in the currents read from an electrically floating body transistor.
Figure 4A:
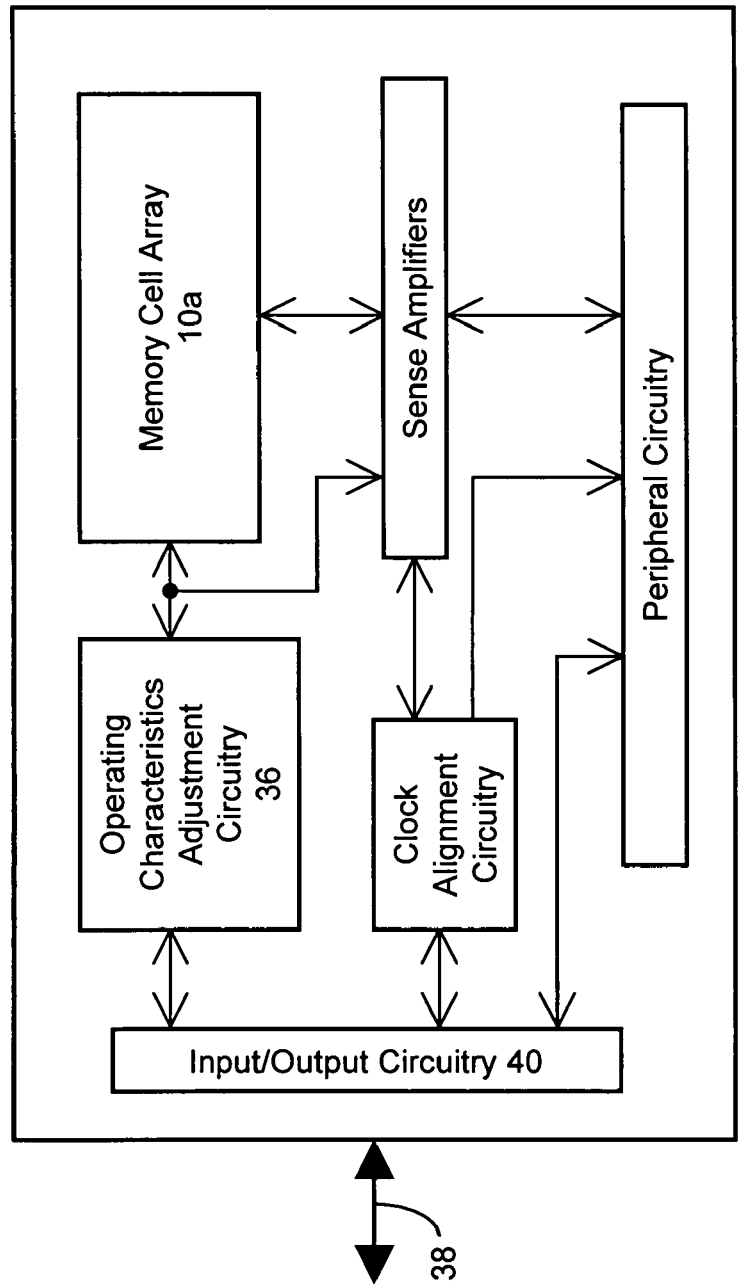
FIGS. 4A and 4B are schematic representations of exemplary memory devices, including an array of electrically floating body transistors and operating characteristics adjustment circuitry, in accordance with certain aspects of the present inventions.

With reference to FIG. 4A, in one embodiment, exemplary memory device 10 includes a memory array 10a, having a plurality of memory cells 12 (see, for example, FIGS. 1A-2B), and operating characteristics adjustment circuitry 36. In one embodiment, operating characteristics adjustment circuitry 36 receives a command generated in device 10 and, in response thereto, adjusts the operating and/or response characteristic(s) of memory cell 12, array 10a and/or device 10. In another embodiment, operating characteristics adjustment circuitry 36 receives an external command on bus or signal lines 38 and responsively adjusts the operating and/or response characteristic(s) of memory cell 12, memory array 10a and/or memory device 10.

Figure 5:
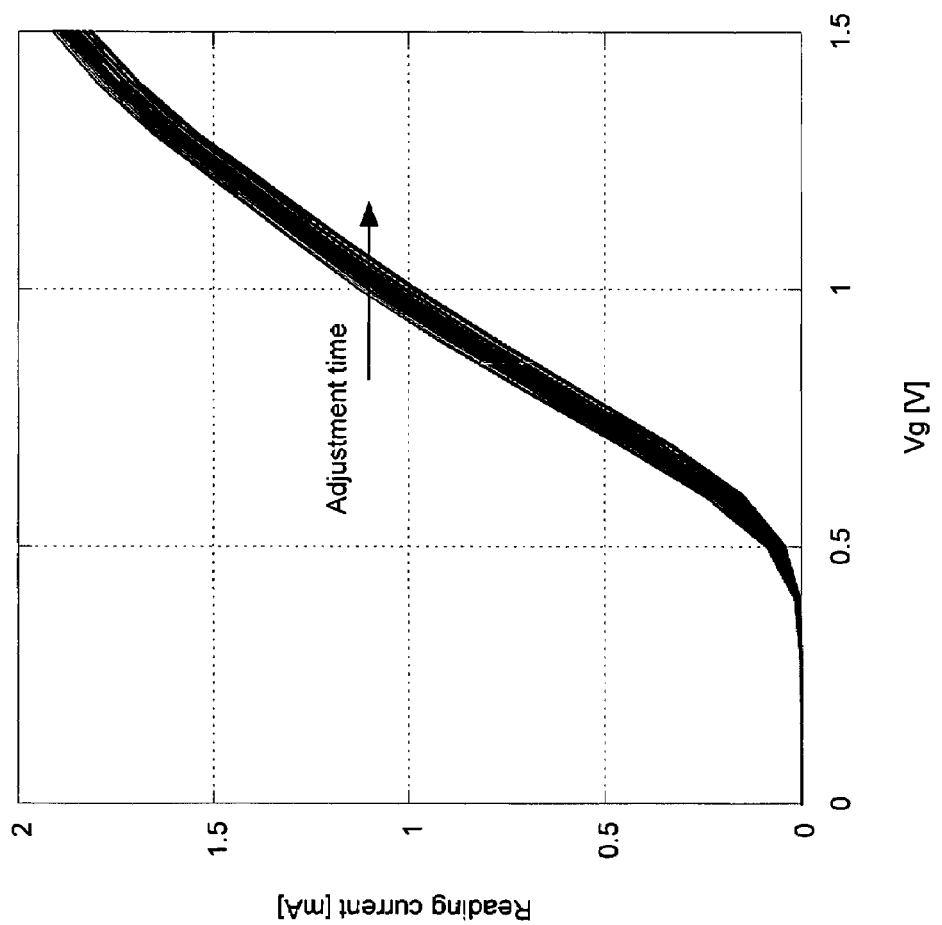
FIG. 5 is a graphical illustration of a threshold voltage shift, in accordance with an exemplary embodiment of the present inventions, induced by applying predetermined voltages to the gate and drain of a MOSFET arranged in an exemplary memory array.

For example, where memory cell 12 is comprised of electrically floating body transistors 14, as described above, sufficiently biasing one or more, or predetermined word lines 28, source lines 30, and/or bit lines 32 of memory array 10a may adjust the operating and/or response characteristic (s) of the corresponding memory cells 12 of memory device 10. In this regard, data states "1" and "0" of one or more, all, or predetermined memory cells 12 (for example, those connected to the biased word lines 28, source lines 30, and bit lines 32) may be adjusted, fine tuned or "tweaked" so that the operating and/or response characteristic(s) of those memory cells 12 is more uniform relative to other memory cells 12 of memory array 10a. The application of the bias to word lines 28, source lines 30 and/or bit lines 32 (see, for example, FIGS. 1A-2B) may provide a threshold voltage shift in those selected or predetermined memory cells 12 thereby causing a change in the read current. (See, FIG. 5).

In another embodiment, operating characteristics adjustment circuitry 36 adjusts the reference voltage which may be employed by a sense amplifier to sense the data state of one, some, all or predetermined memory cells 12 of memory array 10a.In this way, operating characteristics adjustment circuitry 36 improves uniformity of operation and performance of memory cell 12, memory array 10a and/or memory device 10, which leads to greater confidence that the data stored in the memory device is correctly read during, for example, a read operation.

As mentioned above, in one embodiment, a command or control signals may be externally provided to memory device 10 via bus 38. The input/output circuitry 40 may thereafter provide the command or control signals to operating characteristics adjustment circuitry 36 (based on, for example, analysis of the command/control signals by control logic, for example, a state machine (not illustrated)). In response, circuitry 36 may implement one or more adjustment, fine tuning or "tweaking" operations. In one embodiment, the type or form of such operations may be determined by the particular command/control signals (i.e., the control signal selects the type or form of operation). In another embodiment, the control signal initiates one type or form of operation.

Notably, in one embodiment, the adjustment, fine tuning or "tweaking" of the operating and/or response characteristic (s) of one or more, all or predetermined memory cells 12 may be implemented by inducing a specific amount of fixed charge into the gate dielectric of memory cell(s) 12 via application of the bias to word lines 28, source lines 30 and/or bit lines 32. To facilitate this process, initial traps may be induced into the gate dielectric during fabrication.

Floating gate devices, like EEPROM or Flash, provide an additional opportunity for the adjustment. In this case, the device parameters adjustment may be implemented by adjusting, controlling and/or changing the floating gate charge.

Notably, the adjustment, fine tuning or "tweaking" operations in different types of integrated circuit devices may be implemented by electrical modifications as well as, for example, light and radiation.

Figure 6:
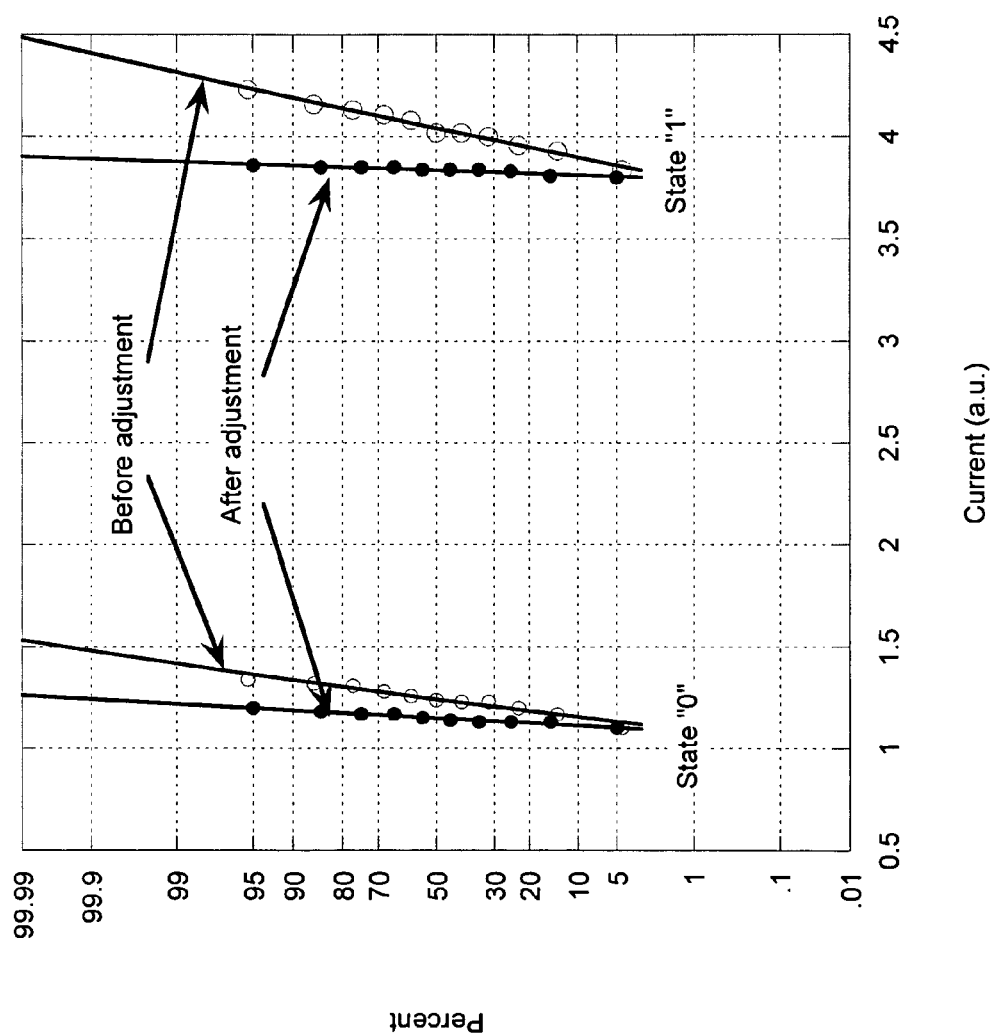
FIG. 6 is a graphical illustration of improved distributions after proposed adjustment in accordance with aspects of the technique of the present inventions.

With reference to FIG. 6, after adjustment, fine tuning or "tweaking" of the operating and/or response characteristic (s) of the given memory cells 12, the distributions of State "1" and State "0" are more uniform. This may provide higher confidence and greater reliability in correctly reading the data stored in memory cell 12 and/or memory device 10.

The adjustment of the operating and/or response characteristic(s) of the memory cell 12, array 10a and/or device 10 may be performed during manufacture (immediately prior to or after packaging), during test and/or in the field, for example, by a controller/processor after device 10 has aged or undergone stress. In those instances where the adjustment is performed in the field (i.e., when deployed in, for example, a system), control signals to engage or enable the on-chip operating characteristics adjustment circuitry 36 (and the adjustment, fine tuning or "tweaking" operations performed thereby), may be provided by control logic 42 resident on memory device 10 and/or via an external controller/processor. (See, FIG. 4B).

Figure 4B:
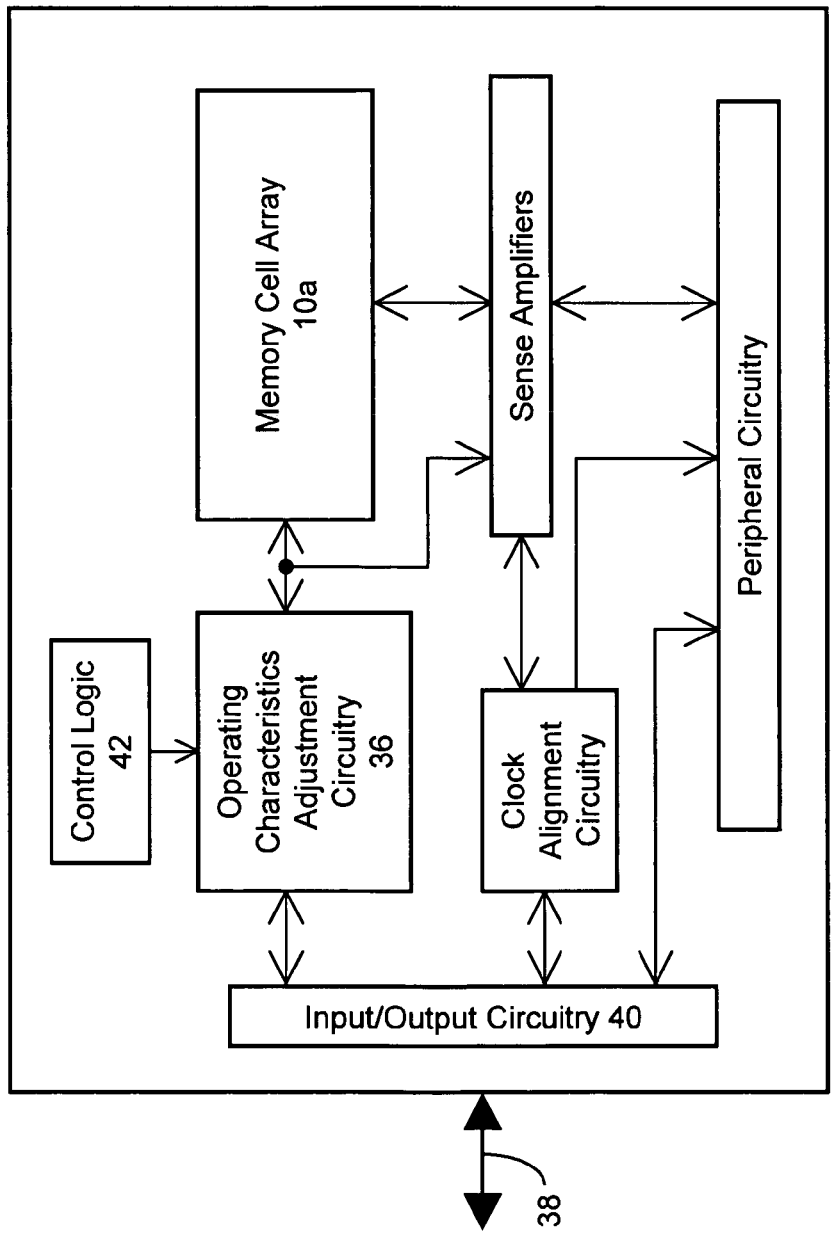

In particular, with continued reference to FIG. 4B, in another exemplary embodiment, memory device 10 includes control logic 42 to enable, control or engage operating characteristics adjustment circuitry 36 to adjust the operation of memory device 10. In one embodiment, the resident control logic 42 may employ external control signals and/or internal data of the response or operation of device 10 to control certain parameters (for example, the threshold voltages of the memory cells and/or the reference voltages of selected circuitry). In this way, memory device 10 may be adjust, correct and/or control certain parameters to accommodate and/or compensate for changes in the operating conditions of predetermined memory cells 12 and/or memory device 10. The control logic 42, in one embodiment, may employ a look-up table and/or a predetermined or mathematical relationship to adjust and/or control the operating and/or response characteristic(s) of all or predetermined memory cells 12 and/or memory device 10.

Figure 7C:
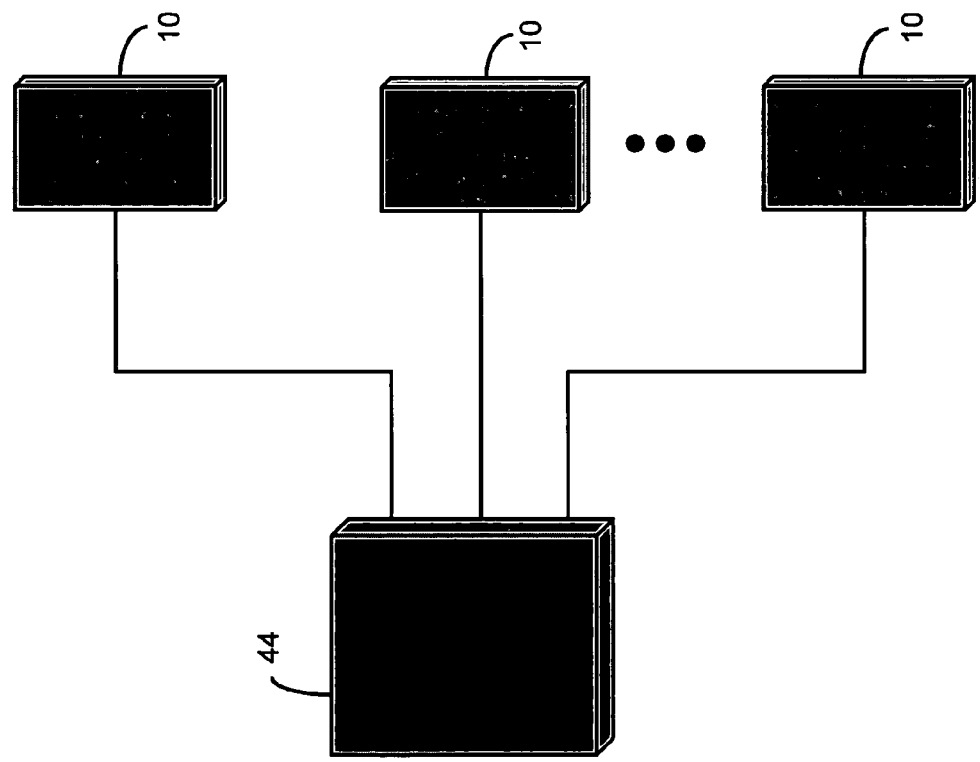

With reference to FIGS. 7A-7C, the control logic 42 may be implemented in external controller/processor 44. External controller/processor 44 may be implemented on module 100 (see, for example, FIG. 7A), in system 1000 having a distributed bus architecture (see, for example, FIG. 7B), and/or in system 1000 having a point-point architecture (see, for example, FIG. 7C). In each embodiment, controller/processor 44 may provide control signals to memory device 10 which, in response, enables or engages the resident operating characteristics adjustment circuitry 36.

In one embodiment, controller/processor 44 may perform an algorithm to determine the operating margins of memory device 10 in order to determine whether to implement the adjustment, fine tuning or "tweaking" operations for memory device 10. In another embodiment, controller/processor 44 may instruct operating characteristics adjustment circuitry 36 to implement the adjustment, fine tuning or "tweaking" operations based on the amount of time memory device 10 has been in operation or deployed in the field. Indeed, controller/processor 44 may employ any type of algorithm or techniques, whether now known or later developed, to determine whether to implement the adjustment, fine tuning or "tweaking" operations for memory device 10.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive, and it should be understood that such other, similar, as well as different, embodiments, features, attributes and advantages of the present inventions are within the scope of the present inventions.

For example, while a considerable portion of the inventions was described in the context of a memory device, memory cell and/or memory array, the present inventions may be implemented in any integrated circuit and/or integrated circuit transistor.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

What is claimed is:

1. An integrated circuit device comprising:
   a memory cell array including a plurality of memory cells wherein each memory cell includes at least one electrically floating body transistor having:
   a source region;
   a drain region;
   a body region disposed between the source region and the drain region, wherein the body region is electrically floating; and
   a gate disposed over the body region and separated therefrom by a gate dielectric; and
   wherein the memory cell includes:
     a first data state representative of a first charge in the body region; and
     a second data state representative of a second charge in the body region; and
   wherein each memory cell includes one or more operating or response characteristics and wherein the plurality of memory cells includes variations in operating or response characteristics; and
   operating characteristics adjustment circuitry, coupled to the memory cell array, to generate one or more signals to responsively adjust one or more operating or response characteristics of at least one predetermined memory cell of the plurality of memory cells, wherein the adjusted one or more operating or response characteristics of the at least one predetermined memory cell reduces a statistical variation of the operating or response characteristics of the plurality of memory cells of the memory cell array.

2. The integrated circuit device of claim 1 wherein the one or more signals include a bias applied to one or more of the word line, source line and/or bit line associated with the at least one predetermined memory cells.

3. The integrated circuit device of claim 1 wherein the one or more signals provide a threshold voltage shift in the at least one predetermined memory cells.

4. The integrated circuit device of claim 1 wherein the one or more signals adjust the reference voltage applied to the sense amplifier which is associated with the at least one predetermined memory cells.

5. The integrated circuit device of claim 1 further including control logic, coupled to the operating characteristics adjustment circuitry, to control the operating characteristics adjustment circuitry.

6. A system comprising:
   a first integrated circuit device including memory cell array including a plurality of memory cells wherein each memory cell includes at least one electrically floating body transistor having:
   a source region;
   a drain region;
   a body region disposed between the source region and the drain region, wherein the body region is electrically floating; and
   a gate disposed over the body region and separated therefrom by a gate dielectric; and
   wherein each memory cell includes:
     a first data state representative of a first charge in the body region; and
     a second data state representative of a second charge in the body region; and
   wherein each memory cell includes one or more operating or response characteristics and wherein the plurality of memory cells includes variations in operating or response characteristics; and
   operating characteristics adjustment circuitry, coupled to the memory cell array, to generate one or more signals to responsively adjust one or more operating or response characteristics of at least one predetermined memory cell of the plurality of memory cells, wherein the adjusted one or more operating or response characteristics of the at least one predetermined memory cell reduces a statistical variation of the operating or response characteristics of the plurality of memory cells of the memory cell array;
   a bus; and
   a second integrated circuit device including control logic, coupled to the operating characteristics adjustment circuitry via the bus, to control the operating characteristics adjustment circuitry.

7. The system of claim 6 wherein the one or more signals include a bias applied to one or more of the word line, source line and/or bit line associated with the at least one predetermined memory cells.

8. The system of claim 6 wherein the one or more signals provide a threshold voltage shift in the at least one predetermined memory cells.

9. The system of claim 6 wherein the one or more signals adjust the reference voltage applied to the sense amplifier which is associated with the at least one predetermined memory cell.

10. The system of claim 6 wherein the operating characteristics adjustment circuitry applies the one or more signals when the first integrated circuit device is in operation or deployed in the field.

11. A method of operating an integrated circuit device comprising a memory cell array including a plurality of memory cells, each memory cell having one or more operating or response characteristics and wherein the plurality of memory cells includes variations in operating or response characteristics, the method comprising:

applying control signals to the memory cells, via associated word, source and/or bit lines, to read the data state of the memory cells; and applying a bias voltage to the word line, source line and/or bit line associated with the at least one predetermined memory cells to responsively adjust one or more operating or response characteristics of the at least one predetermined memory cell of the plurality of memory cells, wherein the adjusted one or more operating or response characteristics of the at least one predetermined memory cells reduces a statistical variation of the operating or response characteristics of the plurality of memory cells of the memory array.

12. The method of claim 11 wherein each memory cell includes at least one electrically floating body transistor having a source region, a drain region, a body region disposed between the source region and the drain region, wherein the body region is electrically floating and a gate disposed over the body region and separated therefrom by a gate dielectric, and wherein the memory cell includes a first data state representative of a first charge in the body region, and a second data state representative of a second charge in the body region, the method further comprising:

applying one or more signals to provide a threshold voltage shift in the at least one predetermined memory cell.

13. The method of claim 11 wherein each memory cell includes a floating gate, the method further comprising:

adjusting the floating gate charge for the at least one predetermined memory cell.

14. The method of claim 11 wherein applying a bias voltage to the word line, source line and/or bit line associated with the at least one memory cell to responsively adjust one or more operating or response characteristics of the at least one predetermined memory cell includes applying the bias voltage when the integrated circuit device is in operation or deployed in the field.

15. The method of claim 11 further including determining the at least one predetermined memory cell when the integrated circuit device is in operation or deployed in the field.

16. The method of claim 11 further including determining the at least one predetermined memory cell when the integrated circuit device during test.

17. The method of claim 11 further including receiving a control signal wherein, in response, the operating characteristics adjustment circuitry applies the bias voltage to the word line, source line and/or bit line associated with the at least one predetermined memory cell to responsively adjust one or more operating or response characteristics of the at least one predetermined memory cell.

18. The method of claim 17 wherein the bias voltage is determined using a look-up table and/or a predetermined or mathematical relationship.

19. The method of claim 11 further including generating a control signal and providing the control signal to the operating characteristics adjustment circuitry wherein, in response, the operating characteristics adjustment circuitry applies the bias voltage to the word line, source line and/or bit line associated with the at least one predetermined memory cell to responsively adjust one or more operating or response characteristics of the at least one predetermined memory cell.

20. The method of claim 19 wherein the bias voltage is determined using a look-up table and/or a predetermined or mathematical relationship.

* * * * *